(12) United States Patent
Davis

(10) Patent No.: US 6,777,956 B2
(45) Date of Patent: Aug. 17, 2004

(54) CAPACITANCE MEASURING SYSTEMS

(75) Inventor: Andrew Ceri Davis, Cheltenham (GB)

(73) Assignee: Smiths Group PLC, London (GB)

( * ) Notice: Subject to any disclaimer, the term of this patent is extended or adjusted under 35 U.S.C. 154(b) by 51 days.

(21) Appl. No.: 10/230,105

(22) Filed: Aug. 29, 2002

(65) Prior Publication Data

US 2003/0042917 A1 Mar. 6, 2003

(30) Foreign Application Priority Data

Sep. 4, 2001 (GB) ................................ 0121418

(51) Int. Cl.$^7$ ............................................. G01R 27/26
(52) U.S. Cl. ....................... 324/658; 324/662; 324/671; 702/104; 73/304 C
(58) Field of Search ................... 324/658–662, 324/664, 666, 671–673, 678, 684, 689; 73/304 C; 340/618

(56) References Cited

U.S. PATENT DOCUMENTS

| | | | |
|---|---|---|---|
| 4,145,619 A | 3/1979 | Tseng | .......................... 307/118 |
| 4,583,402 A | 4/1986 | Myers et al. | ............. 73/304 C |
| 4,860,232 A | 8/1989 | Lee et al. | ................... 702/104 |
| 5,838,241 A | 11/1998 | Lease et al. | ................ 340/618 |

FOREIGN PATENT DOCUMENTS

EP    0285070 A1    10/1988

*Primary Examiner*—Anjan Deb
*Assistant Examiner*—Vicent Q. Nguyen
(74) *Attorney, Agent, or Firm*—Connolly Bove Lodge & Hutz LLP; Larry J. Hume

(57) ABSTRACT

A capacitance fuel-gauging system has a capacitive probe and a reference capacitor charged in opposite senses from respective dc voltage sources via switches operated in antiphase. Two further switches alternately discharge the capacitors to a 0 volts rail. The outputs of the probe and the reference capacitor are connected to a summing node, which is connected to an amplifier via a pair of switches operated in antiphase to rectify the output. The amplifier connects to a processor, which controls the relative outputs of the voltage sources and provides an output indicating the value of the probe.

6 Claims, 1 Drawing Sheet

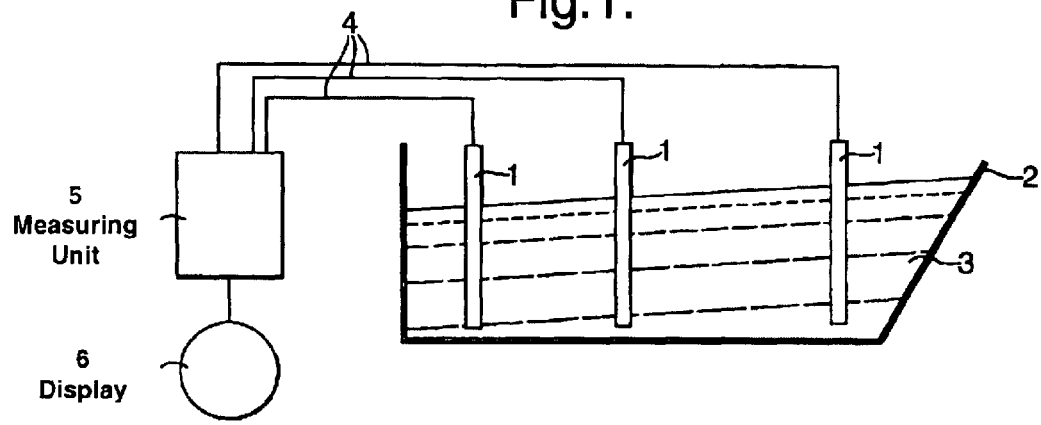
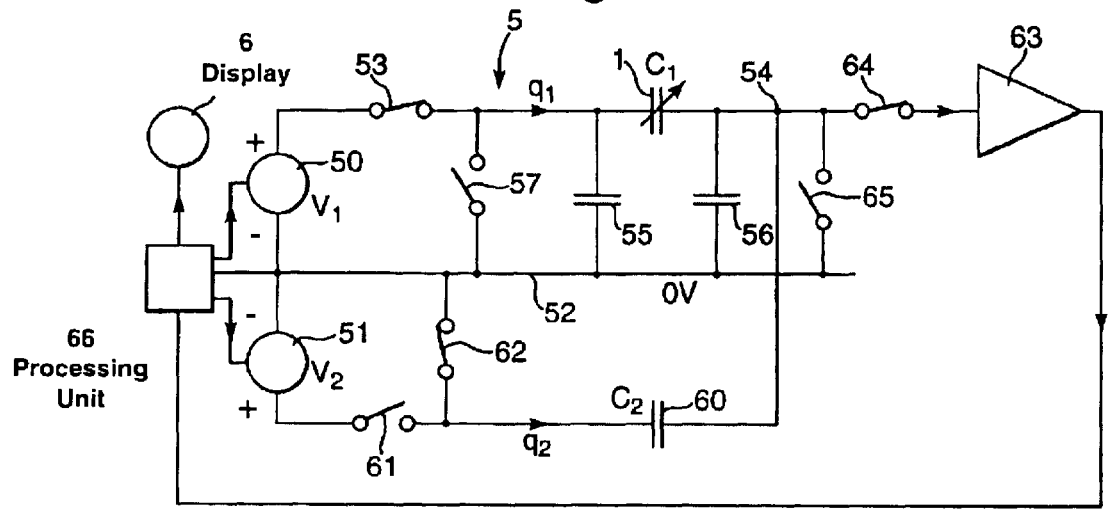

CAPACITANCE MEASURING SYSTEMS

BACKGROUND OF THE INVENTION

This invention relates to capacitance measuring systems.

The invention is more particularly, but not exclusively, concerned with systems for measuring the value of capacitance fluid-gauging probes.

The height of fuel in an aircraft tank is commonly measured using capacitive probes. These take the form of concentric tubes separated from one another by an annular gap, which is filled with fuel to the same height as outside the probe. As the level of fuel rises or falls, the different dielectric properties of the fuel and air cause the capacitance of the probe to change. Most commonly, a balanced bridge circuit is used to measure the value of the probes. The bridge circuit has a reference capacitor, which is adjusted to minimize the output voltage. Alternatively, voltages applied across the two capacitors are adjusted to achieve balance. There are, however, problems in measuring the value of the capacitance probes in this way. The cable interconnecting the probes with the measuring circuit often has a capacitance exceeding that of the probes. Also, aircraft environments often have high levels of electrical noise. Furthermore, the potentially flammable gases above the fuel in the tank make it important to prevent stray currents entering the tank via the gauging system. This is usually overcome by means of zener diode barriers in the circuit but these increase impedance and increase sensitivity to parasitic cable capacitance. Phase delays can occur as a result of the combination of the zener barrier and cable capacitance.

BRIEF SUMMARY OF THE INVENTION

It is an object of the present invention to provide an alternative capacitance measuring circuit.

According to a first aspect of the present invention there is provided a capacitance measuring circuit including a first capacitance to be measured, a second, reference capacitance, a first dc voltage source, a second dc voltage source and switching means operable to charge and discharge the first and second capacitances, the system being arranged such that charges of opposite senses from the first and second capacitances are summed and the outputs of the first and second voltage sources relative to one another are altered such as to minimize the sum of the charges, and the system being arranged to provide an output representative of the capacitance of the first capacitance in accordance with the relative values of the voltage sources.

The switching means preferably includes pairs of switches operated in antiphase with one another such that one connects a voltage source to a capacitance and the other connects a capacitance to ground. The circuit may include amplifier means and switching means operable to rectify and supply the summed charge to the amplifier means. The switching means preferably includes a pair of switches operated in antiphase, one being connected to the amplifier means and the other being connected to ground. An output from the amplifier means is preferably operable to control the relative values of the voltage sources.

According to a second aspect of the present invention there is provided a capacitance measuring circuit including first and second dc voltage sources having one output connected with a 0 volts rail and having their other outputs connected respectively to a capacitance to be measured and to a reference capacitance via respective first and second switches operated in anti-phase with one another, the circuit including a third and fourth switch each connected between the 0 volts rail and respectively the capacitance to be measured and the reference capacitance, the third switch being operated in anti-phase with the first switch and the fourth switch being operated in anti-phase with the second switch, the capacitance to be measured and the reference capacitor being connected to a common summing node, the summing node being connected via rectifying means to processing means operable to control the relative outputs of the first and second voltage sources so as to minimize the charge at the summing node, and the processing means providing an output indicative of the value of the capacitance to be measured.

According to a third aspect of the present invention there is provided a fluid-gauging system, including a capacitive probe arranged to measure height of fluid and a measuring circuit according to the above first or second aspect of the present invention arranged to measure the value of the probe.

The system may include a capacitive cable connecting the probe in the system.

An aircraft fuel-gauging system according to the present invention, will now be described, by way of example, with reference to the accompanying drawings.

BRIEF DESCRIPTION OF THE DRAWINGS

FIG. 1 is a schematic view of the gauging system; and

FIG. 2 is a circuit diagram of the measuring circuit.

DETAILED DESCRIPTION OF THE PREFERRED EMBODIMENT

With reference first to FIG. 1, the fuel-gauging system includes several capacitive gauging probes 1 of the usual kind mounted vertically at various locations in an aircraft fuel tank 2 so that they are immersed in any fuel 3 that is present. The probes 1 are connected via cables 4 to a measuring circuit 5, which provides an output to a display 6, or other utilisation means, representative of fuel quantity, most usually in the form of an indication of mass.

FIG. 2 shows the measuring circuit 5 in more detail as connected with one of the capacitive probes 1. The values of the different probes may be measured by separate measuring circuits or by connecting them in turn to a common circuit. The circuit 5 has two dc voltage sources 50 and 51 of values $V_1$ and $V_2$ connected to opposite sides of a common 0 volts rail 52. One electrode of the probe 1 is connected to the first source 50 via a first switch 53, its other electrode being connected to a summing node 54. A second switch 57 is connected, at one side, between the probe 1 and the first switch 53, and at its opposite side, to the 0 volts rail 52. These two switches 53 and 57 are operated in anti-phase so that when one is open the other is closed. The circuit 5 shows two capacitors 55 and 56 connected between the 0 volts rail 52 and opposite electrodes of the probe, which represent the parasitic capacitance of the cable 4.

The circuit 5 also includes a fixed value reference capacitor 60 having one electrode connected to the summing node 54 and its other electrode connected to the second voltage source 51 via a third switch 61. A fourth switch 62 is connected, at one end, between the reference capacitor 60 and the third switch 61 and, at its other end, to the 0 volts rail 52. The third and fourth switches 61 and 62 are operated in anti-phase so that when one is open the other is closed.

An amplifier 63 has a low impedance input connected to the summing node 54 via a fifth switch 64. This is paired with a sixth switch 65 connected, at one end, between the 0 volts rail 52 and, at its opposite end, between the summing node 54 and the fifth switch. These two switches 64 and 65 are switched in anti-phase so that when one is open the other is closed. The output of the amplifier 63 is connected to a processing unit 66. The processing unit 66 is connected to control inputs of the two voltage sources 50 and 51 and also provides an output to the display 6.

In operation, initially, the switches 53 and 62 are closed and switches 57 and 61 are open so that the probe capacitor 1 and the reference capacitor 60 are charged by their respective voltage sources 50 and 51 in opposite senses. A charge of $q_1$ flows to the summing node 54 from the probe capacitor 1, where $q_1 = C_1 \times V_1$. Similarly, an opposite charge of $q_2$ flows to the summing node 54 from the reference capacitor 60, where $q_2 = C_2 \times V_2$. The pair of switches 64 and 65 is synchronized to operation of the other switches 53, 57, 61 and 62 and half-wave rectifies the summed charge at the summing node 54 so that a dc component of the summed charge is presented to the input of the amplifier 63. The resultant output of the amplifier 63 is used by the processor 66 to alter the relative values $V_1$ and $V_2$ of the voltage sources 50 and 51 in such a way that the summed charge at the node 54 is minimized. The processor 66 calculates the value of the probe capacitor 1 from the expression:

$$C_1 = C_2 \times V_2 / V_1$$

The capacitors 1 and 60 are subsequently charged in the opposite sense by closing the switches 57 and 61 and by opening the switches 53 and 62.

The arrangement of the present invention is insensitive to the cable capacitances 55 and 56 and enables capacitance to be measured precisely even in the presence of a variable cable capacitance of greater magnitude. The present invention also has advantages where zener diodes or similar devices are used to prevent fault currents flowing to the measuring capacitor, since the switched charges used in the present arrangement propagate through such a filter more accurately without phase distortion. The switches used in the present invention to control the charge are relatively insensitive to electrical noise. Because precise charges can be generated directly from dc voltages, there is no need to generate and modulate sine waves as in previous arrangements.

In the arrangement described above the switches are operated at a constant rate. However, if used in the presence of electrical noise having a frequency close to the switching frequency, or one of its harmonics, it may be necessary to modulate the switching rate to reduce noise errors. Suitable modulation schemes could include sine, triangle, square or random/pseudo-random modulation.

It will be appreciated that the present invention is not confined to fuel-gauging or other fluid-gauging applications but could be used to measure other capacitances.

What is claimed is:

1. A capacitance measuring system comprising:
   a capacitance to be measured;
   a reference capacitance;
   a first dc voltage source;
   a second dc voltage source;
   a 0 volts rail connected to an output of each dc voltage source;
   a first pair of switches operated in antiphase with one another to connect said capacitance to be measured alternately between said first dc voltage source and said 0 volts rail;
   a second pair of switches operated in antiphase with one another to connect said reference capacitance alternately between said second voltage source and said 0 volts rail;
   a summing node connected between said capacitance to be measured and said reference capacitance;
   a rectifying arrangement connected with said summing node;
   a processor connected with said rectifying arrangement,
   said processor being operable to control the relative outputs of said first and second voltage sources so as to minimize the charge at said summing node, and
   wherein said processor provides an output indicative of the value of said capacitance to be measured.

2. A fluid-gauging system according to claim 1 comprising a capacitive cable connecting said probe to the measuring system.

3. A capacitance measuring circuit, the circuit comprising:
   a capacitor to be measured;
   a reference capacitor,
   a first dc voltage source;
   a second dc voltage source connected to one terminal of the second dc voltage source; a first pair of switches operated in antiphase with one another,
   one switch of said first pair being connected between said capacitor to be measured and said first dc voltage source such that said capacitor is charged when said one switch of said first pair is closed,
   another switch of said first pair being connected between said capacitor to be measured and a ground potential such that said capacitor is discharged when said another switch of said first pair is closed;
   a second pair of switches operated in antiphase with one another,
   one switch of said second pair being connected between said reference capacitor and said second dc voltage source such that said reference capacitor is charged when said one switch of said second pair is closed,
   another switch of said second pair being connected between said reference capacitor and the ground potential such that said reference capacitor is discharged when said another switch of said second pair is closed,
   wherein the measuring circuit is arranged such that respective charges of opposite polarities on said capacitor to be measured and said reference capacitor are summed;
   an amplifier;
   a third pair of switches operably connected to connect a dc component of the summed charge to an input of the amplifier,
   processing means operably connected to an output of the amplifier for controlling outputs of the first and second dc voltage sources and minimizing the summed charge;
   output means operably connected to the processing means for providing an output representative of a capacitance value of said first capacitance in accordance with the relative values of said first and second dc voltage sources.

4. A capacitance measuring circuit according to claim 3, wherein said third pair of switches includes a switch connected to an input of said amplifier and a switch connected to the ground potential,
   wherein switches of said third pair of switches are switched in antiphase with one another.

5. A fluid-gauging system comprising:
a tank;
a capacitive gauging probe arranged in a fluid in the tank;
a reference capacitance;
a first dc voltage source;
a second dc voltage source;
a first pair of switches operated in antiphase with one another,
one switch of said first pair being connected between said probe and said first voltage source such that said probe is charged when the switch is closed,
another switch of said first pair being connected between said capacitive gauging probe and ground such that said capacitive gauging probe is discharged when the switch is closed;
a second pair of switches operated in antiphase with one another,
one switch of said second pair being connected between said reference capacitance and said second voltage source such that said reference capacitance is charged when the switch is closed,
another switch of said second pair being connected between said reference capacitance and a ground potential such that said reference capacitance is discharged when said another switch is closed,
wherein charges of opposite senses from said capacitive gauging probe and said reference capacitance are summed and rectified by a third pair of switches and thereafter amplified to produce a signal which controls voltage outputs of the first and second voltage sources relative to one another so as to minimize the sum of said charges; and
an output representative of a capacitance value of said capacitive gauging probe determined in accordance with relative values of said first and second dc voltage sources.

6. A capacitance measuring circuit, comprising:
a capacitive probe having a variable capacitance value which depends upon an external influence acting on the capacitive probe,
wherein one terminal of the capacitive probe is connected to a common circuit node;
first and second controllable dc voltage sources sharing a ground potential node therebetween;
first switching means operatively connected between the first controllable dc voltage source and the ground potential node for alternatively charging and discharging the capacitive probe;
a reference capacitor;
second switching means operatively connected between the second controllable dc voltage source and the ground potential node (or alternatively charging and discharging the reference capacitor,
wherein one terminal of the reference capacitor is connected to the common circuit node;
rectifying means connected to said summing node for providing a dc component of a net charge presented to the common circuit node;
processor means operably connected to said summing mode for controlling relative outputs of said first and second voltage sources and for controlling said first switching means, said second switching means, and said rectifying means so as to minimize the net charge at said common circuit node,
wherein said processor means provides an output indicative of the variable capacitance value.

* * * * *